(12) United States Patent
Sakata et al.

(10) Patent No.: US 7,144,524 B2
(45) Date of Patent: *Dec. 5, 2006

(54) SIALON-BASED PHOSPHOR AND ITS PRODUCTION METHOD

(75) Inventors: Shin-ichi Sakata, Ube (JP); Tetsuo Yamada, Ube (JP)

(73) Assignee: Ube Industries, Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/892,735

(22) Filed: Jul. 16, 2004

(65) Prior Publication Data

US 2005/0012075 A1   Jan. 20, 2005

(30) Foreign Application Priority Data

Jul. 16, 2003   (JP) .............................. 2003-197675

(51) Int. Cl.
*G02F 2/02*   (2006.01)
*C09K 11/59*   (2006.01)
*C09K 11/64*   (2006.01)

(52) U.S. Cl. ........................ 252/301.4 F; 252/301.4 R; 313/503; 25/98

(58) Field of Classification Search ............... 501/98.2; 252/301.4 R, 301.6 F, 301.4 F; 313/503; 257/98

See application file for complete search history.

(56) References Cited

U.S. PATENT DOCUMENTS 6,632,379 B1 * 10/2003 Mitomo et al. ....... 252/301.4 R
6,657,379 B1 * 12/2003 Ellens et al. ................. 313/503
6,670,748 B1 * 12/2003 Ellens et al. ................. 313/503
6,674,233 B1 * 1/2004 Ellens et al. ................. 313/503
6,776,927 B1 * 8/2004 Mitomo et al. ....... 252/301.4 R
7,074,346 B1 * 7/2006 Yamada et al. ....... 252/301.4 F
2003/0052595 A1    3/2003 Ellens et al.
2003/0094893 A1    5/2003 Ellens et al.
2003/0168643 A1 *  9/2003 Mitomo et al. ............. 252/500
2004/0155225 A1 *  8/2004 Yamada et al. ....... 252/301.4 R
2005/0116244 A1 *  6/2005 Sakata et al. ................. 257/98

FOREIGN PATENT DOCUMENTS

EP    1 264 873 A2    12/2002
JP    2002-363554  *  12/2002
JP    2004 067837 A   3/2004

\* cited by examiner

*Primary Examiner*—Karl Group
(74) *Attorney, Agent, or Firm*—DLA Piper US LLP

(57) ABSTRACT

To provide a Sialon-based phosphor having a high photoluminescent intensity, which can realize a high brightness LED, particularly a white LED using a blue LED as the light source, and a production method of the Sialon-based phosphor. The α-Sialon based phosphor of the present invention is represented by the formula:

$$Li_xM_yLn_zSi_{12-(m+n)}Al_{(m+n)}O_nN_{16-n} \quad (I)$$

wherein M is at least one metal selected from Ca, Mg and Y, Ln is at least one lanthanide metal selected from Eu, Dy, Er, Tb, Yb and Ce, $x+ay+bz=m$ (assuming that the valence of metal M is a and the valence of lanthanide metal Ln is b), $0<x\leq0.8$, $0<y$, $0<z$, $0.3\leq m<4.5$, and $0<n<2.25$.

13 Claims, 4 Drawing Sheets

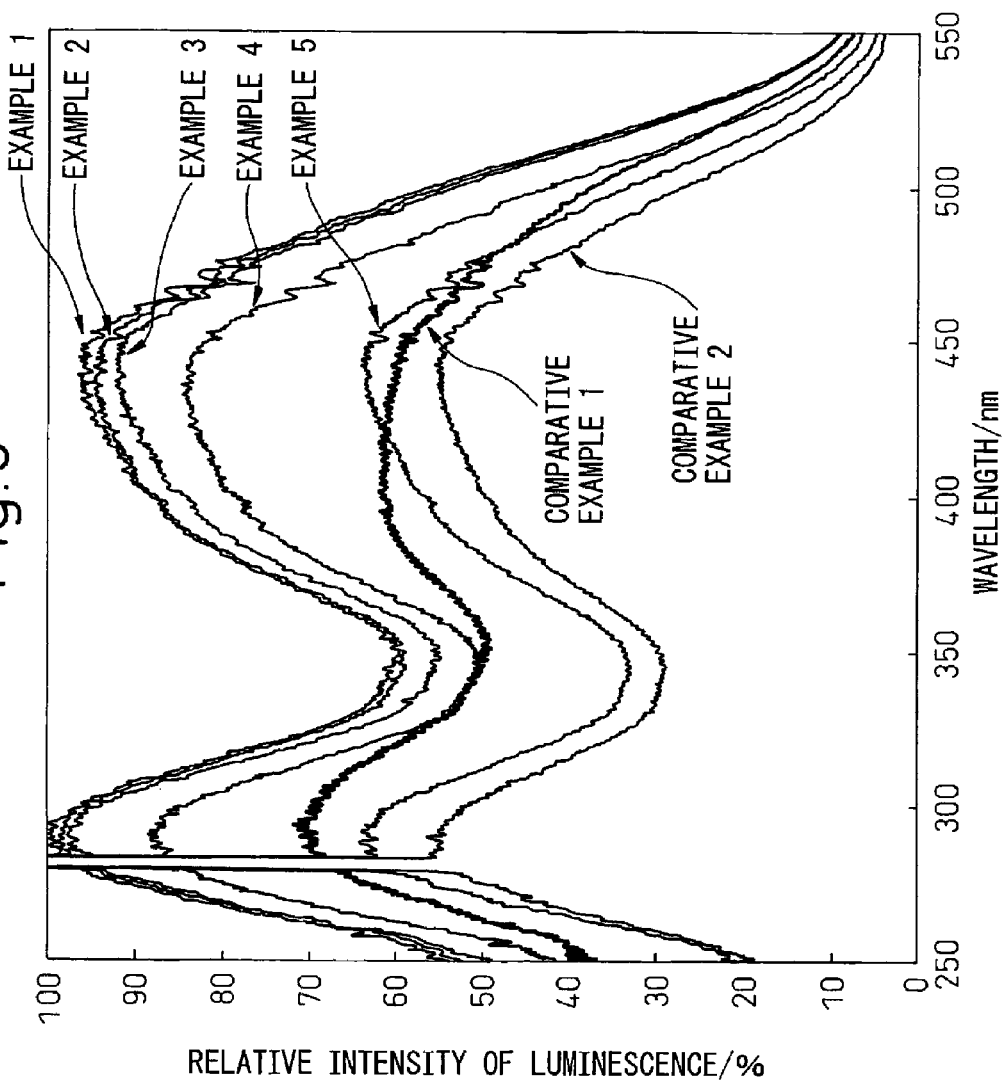

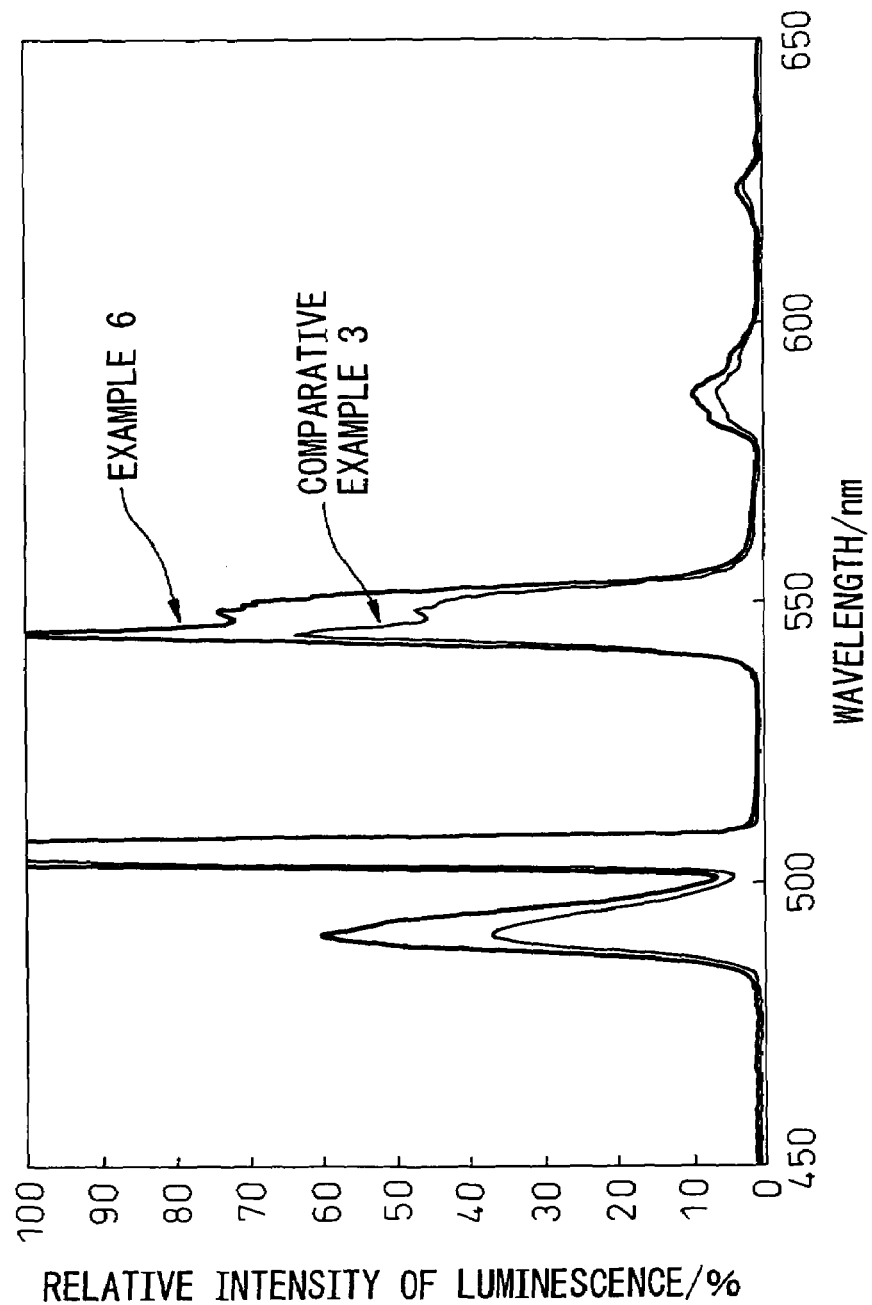

SIALON-BASED PHOSPHOR AND ITS PRODUCTION METHOD

TECHNICAL FIELD

The present invention relates to a material having a function of converting a part of an irradiated light into light with a wavelength different from the irradiated light and, at the same time, mixing the converted light with the unconverted irradiation light to cause a conversion to light having a different color. More specifically, the present invention provides an oxynitride phosphor activated by a rare earth metal element, which can realize a high brightness light emitting diode (LED), particularly a white light emitting diode (white LED) using a blue light emitting diode (blue LED) or a violet light emitting diode (violet LED) as the light source.

DESCRIPTION OF THE RELATED ART

With the recent practical implementation of a blue LED, studies are being aggressively made to develop a white LED by utilizing the blue LED. The white LED is low in the power consumption and has an extended in the life as compared with existing white light sources and therefore, its application to a liquid crystal panel backlight, an indoor or an outdoor illumination device, and the like, is proceeding.

The white LED developed at present is obtained by coating Ce-doped YAG (yttrium.aluminum.garnet) phosphor on the surface of blue LED. However, the Ce-doped YAG has a photoluminescent wavelength in the vicinity of 530 nm and when this photoluminescent light and the light of blue LED are mixed to provide white light, the color of the resulting light is slightly blue-tinted and a desirable shade of white light cannot be obtained on the other hand, a Sialon-based phosphor activated by a rare earth element is known to emit photoluminescent light with longer wavelength (shifted to the red side) than the photoluminescent light of Ce-doped YAG (see, Japanese Unexamined Patent Publication (Kokai) No. 2002-363554). When this light of Sialon-based phosphor is mixed with the light of blue LED, good shade of white light can be obtained. In this way, practical use of a Sialon-based phosphor as a new phosphor material is expected.

However, the phosphor having a composition disclosed in Japanese Unexamined Patent Publication (Kokai) No. 2002-363554 is produced in a lumped shape by using a hot pressing apparatus and for realizing its practical use, a pulverized phosphor with more increased photoluminescent intensity must be developed. An object of the present invention is to provide a Sialon-based phosphor having a high photoluminescent intensity which can realize high brightness of an LED, and a production method thereof.

SUMMARY OF THE INVENTION

The present inventors have found that when a small amount of lithium is added to an α-Sialon based phosphor, the photoluminescent intensity is remarkably enhanced (the photoluminescent intensity of an α-Sialon based phosphor of the present invention is higher than that of the same α-sialon without the Li substitution). Furthermore, in the production of this sialon, when an amorphous silicon nitride powder is used, the sialon can be efficiently obtained without a hot pressing treatment.

That is, the present invention relates to the following:

(1) An α-Sialon based phosphor represented by the formula:

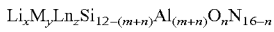

$$Li_xM_yLn_zSi_{12-(m+n)}Al_{(m+n)}O_nN_{16-n}$$

wherein M is at least one metal selected from Ca, Mg and Y, Ln is at least one lanthanide metal selected from Eu, Dy, Er, Tb, Yb and Ce, x+ay+bz=m (assuming that the valence of metal M is a and the valence of lanthanide metal Ln is b), $0<x\leq0.8$, $0<y\leq1.5$, $0<z\leq1.5$, $0.3\leq m<4.5$, and $0<n<2.25$.

(2) The α-Sialon based phosphor as described in (1) above, wherein the metal M is Ca and the lanthanide metal Ln is Eu.

(3) The α-Sialon based phosphor as described in (1) or (2) above, wherein x is $0.01<x\leq0.3$.

(4) The α-Sialon based phosphor as described in (3) above, wherein x is $0.03<x\leq0.2$.

(5) The α-Sialon based phosphor as described in any one of (1) to (4), wherein $1.0\leq m\leq3.5$ and $0.5\leq n\leq2.0$.

(6) A method for producing the α-Sialon based phosphor described in any one of (1) to (5) above, comprising:

mixing an oxide of Li, or a precursor substance working out to the oxide upon thermal decomposition, an amorphous silicon nitride, aluminum compound containing AlN and working out to an aluminum source, an oxide of said metal M, or a precursor substance working out to the oxide upon thermal decomposition, and an oxide of the lanthanide metal Ln, or a precursor substance working out to the oxide upon thermal decomposition, and firing the resulting powder mixture at 1,400 to 2,000° C. in an inert gas atmosphere containing nitrogen.

(7) The method for producing the α-Sialon based phosphor as described in (6) above, wherein said amorphous silicon nitride is an amorphous silicon nitride powder obtained by the thermal decomposition of silicon diimide (Si(NH)$_2$).

(8) The method for producing the α-Sialon based phosphor as described in (6) or (7) above, wherein said firing is performed at 1,600 to 2,000° C. in a nitrogen atmosphere under pressure.

(9) A light emitting diode apparatus comprising a light emitting diode and the α-Sialon based phosphor described in any one of (1) to (5).

(10) A white light emitting diode apparatus comprising a blue or violet light emitting diode and the α-Sialon based phosphor described in any one of (1) to (5).

(11) The white light emitting diode apparatus as described in (10), wherein in said α-sialon phosphor, the metal M is Ca and the lanthanide Ln is Eu.

(12) The light emitting diode apparatus as described in any one of (9) to (11), wherein the α-Sialon based phosphor is dispersed in a resin.

BRIEF DESCRIPTION OF THE DRAWINGS

FIG. 3 is a view showing the excitation spectra of the Sialon-based phosphor varied in the amount of Li.

FIG. 4 is a photoluminescent spectra of Example 6 and Comparative Example 3.

MODES OF CARRYING OUT THE INVENTION

Figure 1:
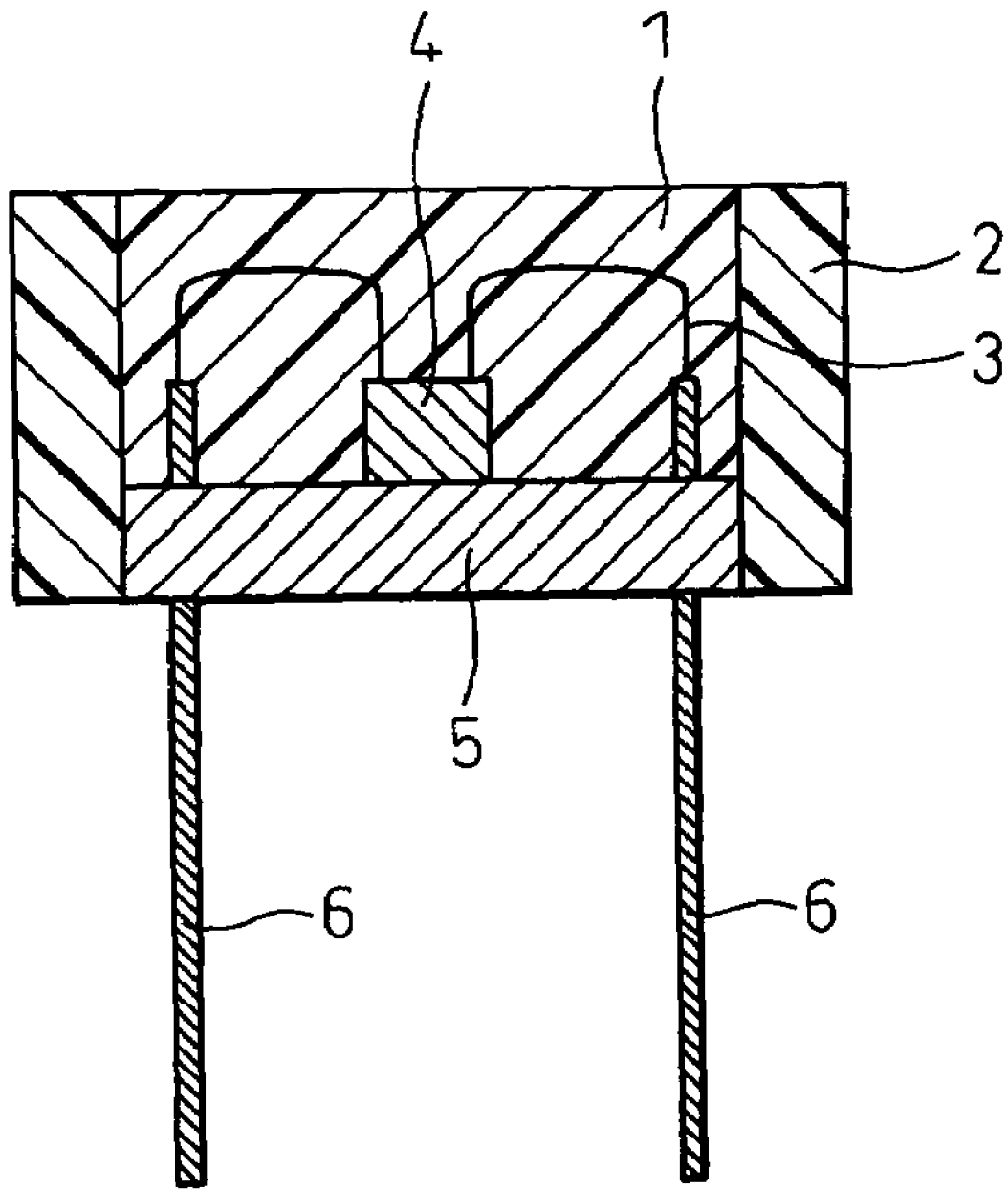
FIG. 1 shows a schematic view of a light emitting diode.

The present invention is described in detail below.

The α-sialon is obtained by solid-dissolving a slight amount of metal M in a composition comprising Si, Al, O and N, and this is represented by the formula:

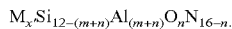
$$M_xSi_{12-(m+n)}Al_{(m+n)}O_nN_{16-n}.$$

The α-Sialon based phosphor is obtained by displacing a part of the interstitially dissolved metal M with a lanthanide metal Ln working out to the center of emission "working out to" means "become".

The α-Sialon based oxynitride phosphor of the present invention is obtained by further displacing a part of the interstitially dissolved metal M with Li and this is represented by formula (1):

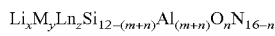
$$Li_xM_yLn_zSi_{12-(m+n)}Al_{(m+n)}O_nN_{16-n}$$

The metal M solid-dissolved is at least one metal selected from Ca, Mg and Y, and the lanthanide metal Ln working out to the center of emission is at least one member selected from Eu, Dy, Er, Tb, Yb and Ce. In formula (1), assuming that the valence of metal M is a and the valence of lanthanide metal Ln is b, x+ay+bz=m.

In formula (1), the factor x of Li is preferably larger than 0 and up to 0.8. The lithium mixed even in a very small amount exerts an effect and the phosphorescence intensity is remarkably enhanced. However, if x exceeds 0.8, the photoluminescent intensity tends to decrease. The content (factor x) of Li is more preferably from 0.01 to 0.3, still more preferably from 0.03 to 0.2. With the content in this range, a higher photoluminescent intensity can be obtained.

In formula (1), the factors m and n are $0.3 \leq m < 4.5$ and $0 < n < 2.25$. If m and n are out of respective ranges, the α-sialon is hardly formed and this is not preferred. The factors m and n are more preferably $1.0 \leq m \leq 3.5$ and $0.5 \leq n \leq 2.0$.

The photoluminescent color of the α-sialon phosphor varies depending on the kind of the interstitially dissolved metal M but, in the present invention, Li is added to the α-sialon phosphor, whereby the photoluminescent brightness can be enhanced in any photoluminescent color. In particular, when Ca is used as the metal M solid-dissolved in the α-sialon of the present invention and Eu is used as the lanthanide metal Ln, the phosphor has a yellow color (wavelength: about 560 to 590 nm) and this is optimal for obtaining a white LED.

The method for producing the α-Sialon based phosphor of the present invention capable of giving a high photoluminescent intensity is described below. The powder of the α-Sialon based phosphor of the present invention is obtained by mixing (a) an oxide of Li, or a precursor substance working out to an Li oxide upon thermal decomposition, (b) an amorphous silicon nitride, (c) a aluminum compound containing AlN, and working out to an aluminum source, (d) an oxide of the metal M, or a precursor substance working out to the oxide upon thermal decomposition, and (e) an oxide of the lanthanide metal Ln, or a precursor substance working out to the oxide upon thermal decomposition to give a desired α-sialon composition, and firing the resulting powder mixture at 1,400 to 2,000° C. in an inert gas atmosphere. Here, the aluminum compound containing AlN and working out to an aluminum source is AlN powder alone, a combination of AlN powder and Al powder, or a combination of AlN powder and powder of Al oxide or a precursor substance working out to an Al oxide upon thermal decomposition, and this works out to an Al source and/or a nitrogen or oxygen source of the α-sialon.

Examples of the precursor substance which works out to an oxide of Li, Al, metal M or lanthanide metal Ln upon thermal decomposition include nitride, hydroxide, carbonate, oxalate and chloride of respective elements.

More specifically, examples of the Li oxide, and the precursor substance working out to an Li oxide upon thermal decomposition, include $Li_2O$, $Li_2CO_3$, LiOH and LiCl. Examples of the Al oxide, and the precursor substance working out to the oxide upon thermal decomposition, include $Al_2O_3$ and $Al(OH)_3$. Examples of the metal M oxide, and the precursor substance working out to the oxide upon thermal decomposition include, in the case where M is Ca, $CaCO_3$, $Ca(COO)_3$, $Ca(OH)_2$ and $CaCl_2$. Examples of the lanthanide metal Ln oxide, and the precursor substance working out to the oxide upon thermal decomposition include, in the case where Ln is Eu, $Eu_2O_3$, $EuCl_3$, $Eu_2(C_2O_4)_3 \cdot xH_2O$ and $Eu(NO_3)_3$. The Li oxide or the precursor substance working out to an Li oxide upon thermal decomposition, the Al oxide, or the precursor working out to the oxide upon thermal decomposition, the metal M oxide, or the precursor substance working out to the oxide upon thermal decomposition, and the lanthanide metal Ln oxide, or the precursor substance working out to the oxide upon thermal decomposition each is preferably used in the powder state.

In particular, an amorphous silicon nitride powder is preferably used as the raw material in the above-described production method. If crystalline silicon nitride is used, a normal powder preparation method of mixing raw materials and firing the mixture in a crucible produces sialon powder containing large amount of unreacted silicon nitride due to low reactivity of silicon nitride and the sialon powder cannot be efficiently produced. In order to accelerate the formation of Sialon, a method of accelerating the reaction such as hot pressing treatment is necessary. In this method, the sialon is obtained as a lump of a sintered body. For obtaining a phosphor powder from the lump, a grinding step is necessary but, in the grinding step, contamination of impurities occurs and due, to the contamination of iron or the like harmful to the phosphor, the photoluminescent intensity decreases. In order to avoid such a problem, it is important to use an amorphous silicon nitride powder as the raw material. The amorphous silicon nitride powder has high reactivity and therefore, a sialon powder can be obtained by a simple method of mixing raw materials and firing the mixture in a crucible under nitrogen containing inert gas atmosphere.

Particularly, an amorphous silicon nitride powder obtained by a method called an imide thermal decomposition method where silicon diimide ($Si(NH)_2$) is decomposed by heating at 600 to 1,200° C. in a nitrogen or ammonia gas atmosphere is a fine particle having an average particle size of approximately from 0.005 to 0.05 μm and therefore, the reactivity of this powder is very high. When an amorphous silicon nitride powder obtained by the imide thermal decomposition method is used as the raw material, a phosphor having high photoluminescent intensity can be obtained and this is preferred. The amorphous silicon nitride powder is in a so-called amorphous state without exhibiting any clear diffraction peak when measured by a normal X-ray diffraction method. Depending on the heating conditions, a powder exhibiting a faint X-ray diffraction peak may be obtained but such a powder is also included in the amorphous silicon nitride powder as used in the present invention. In the production method of the present invention, the amorphous silicon nitride powder may contain a nitrogen-containing silane compound adjusted to an oxygen content of 1 to 5 mass %.

The method for mixing respective starting materials is not particularly limited and a known method such as a method of dry-mixing the starting materials or a method of wet-mixing the starting materials in an inactive solvent substantially incapable of reacting with each component of the raw materials and then removing the solvent, may be employed. As for the mixing equipment, a V-shaped mixer, a rocking mixer, a ball mill, a vibration mill, a medium stirring mill or the like is suitably used. However, the nitrogen-containing silane compound and/or the amorphous silicon nitride powder are very sensitive to water or moisture and therefore, the mixing of starting materials must be performed in a controlled inert gas atmosphere.

The mixture of starting materials is fired at 1,400 to 1,800° C., preferably from 1,500 to 1,800° C., in a nitrogen-containing inert gas atmosphere under 1 atm., whereby a desired α-sialon powder is obtained. If the firing temperature is less than 1,400° C., heating for a long time is necessary for the production of the desired α-sialon powder and this is not practical. Also, the production ratio of α-sialon phase in the resultant powder decreases. On the other hand, if the firing temperature exceeds 1,800° C., this disadvantageously causes sublimation and decomposition of silicon nitride and sialon to produce free silicon.

The powder mixture of starting materials can also be fired at a temperature of 1,600 to 2,000° C., preferably from 1,600 to 1,900° C., in a pressurized nitrogen gas atmosphere. In this case, the pressurized nitrogen gas prevents the silicon nitride and sialon from sublimating and decomposing at a high temperature and a desired α-Sialon based phosphor can be obtained in a short time. By increasing the nitrogen gas pressure, the firing temperature can be elevated, but the powder mixture can be fired, for example, at 1,600 to 1,850° C. under a nitrogen gas pressure of 5 atm and at 1,600 to 2,000° C. under a nitrogen gas pressure of 10 atm.

The furnace used for the firing of powder mixture is not particularly limited and, for example, a batch electric furnace, using a high frequency induction heating system or resistance heating system, a rotary kiln, a fluidized kiln or a pusher type electric furnace can be used.

The α-Sialon based phosphor activated by a rare earth element of the present invention is kneaded with a transparent resin such as epoxy resin or acrylic resin by a known method to produce a coating composition, and a light emitting diode surface-coated with this coating composition is used as a light conversion element.

FIG. 1 schematically shows one example of a light emitting diode apparatus. The diode apparatus 10 comprises an α-sialon phosphor-containing resin layer (a light conversion element) 1, a container 2, gold wires 3, a light emitting element 4, a stage 5 with electrode pads, and electrodes 6. The powder of the α-sialon phosphor of the present invention is dispersed in a resin. When a light is emitted from the light emitting element 4, the emitted light irradiates the α-sialon phosphor particles which then absorbs the irradiated light and emits a photoluminescent light having a wavelength different from that of the irradiated light (emitted from the light emitting element 4), and the photoluminescent light (converted light) from the α-sialon phosphor and the unconverted light emitted from the light emitting element 4 are mixed in the α-sialon phosphor-containing resin layer 1 to produce a light having a color tone different from that of the light emitted from the light emitting element 4. The constitution of the light emitting diode apparatus is not limited to that of FIG. 1.

In accordance with the present invention, in a phosphor where a part of the metal dissolved interstitially in a Sialon-based oxynitride is displaced with a lanthanide metal, when a part of the interstitially dissolved metal is further displaced with Li, a phosphor remarkably elevated in the photoluminescent intensity can be obtained.

EXAMPLES

Comparative Example 1

Figure 2:
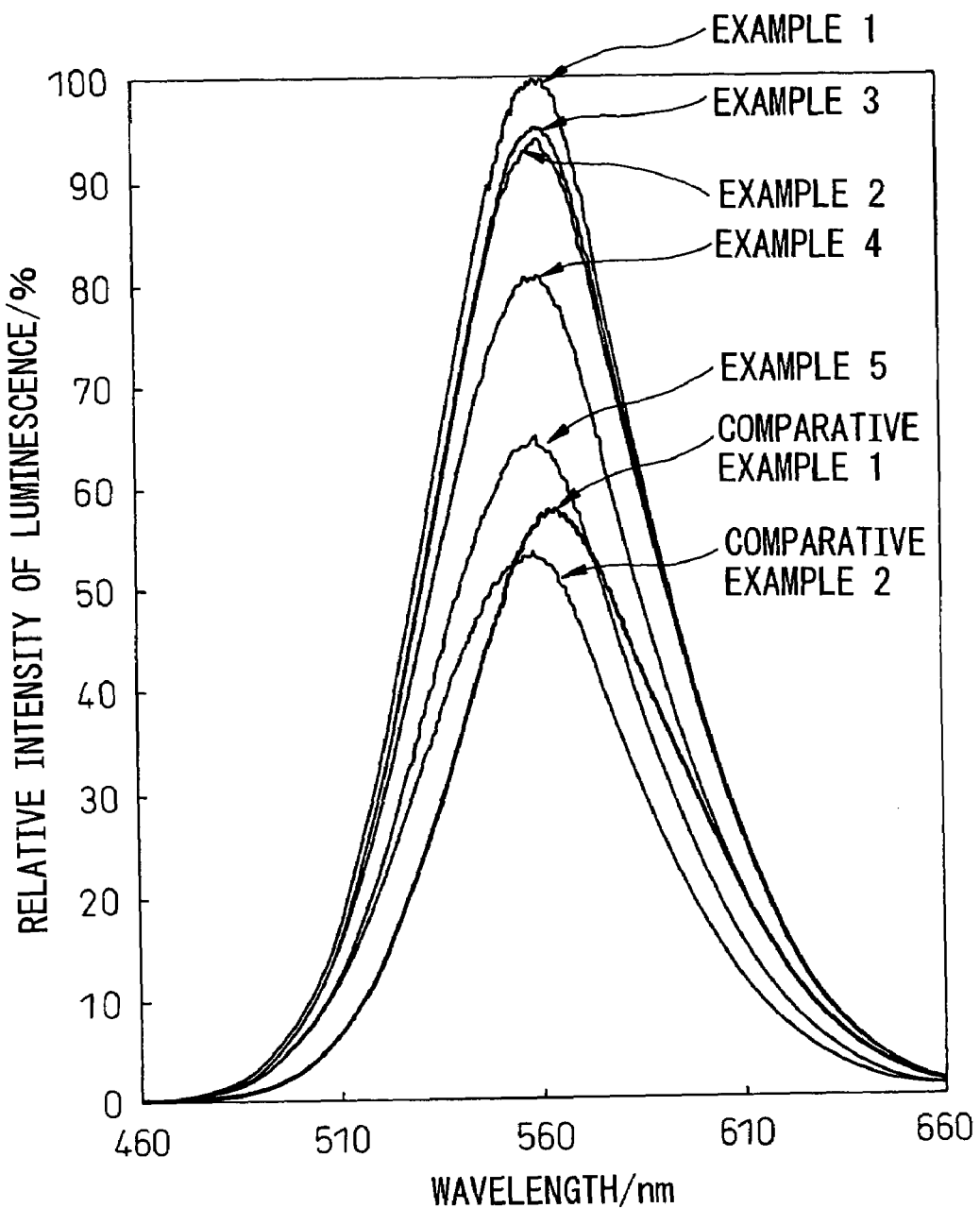
FIG. 2 is a view showing the photoluminescent spectra of the Sialon-based phosphor varied in the amount of Li.

An amorphous silicon nitride powder obtained by the thermal decomposition of silicon diimide produced by reacting silicon tetrachloride and ammonia at room temperature, an aluminum nitride powder, a calcium carbonate powder and a europium oxide powder were weighed to give a composition shown in Comparative Example 1 of Table 1. In Comparative Example 1, the amount x of Li was 0. The weighed powders were mixed by a vibration mill for 1 hour in a nitrogen atmosphere. The resulting powder mixture was filled in a carbon crucible, the crucible was set in a induction heating furnace and the furnace was heated by a temperature-rising schedule of holding the furnace at from temperature to 1,200° C. for 1 hour, at from 1,200 to 1,400° C. for 4 hours and at from 1,400 to 1,700° C. for 3 hours, whereby a sialon powder was obtained. This powder was evaluated on photoluminescent properties by a photoluminescent measuring apparatus set to an excitation wavelength of 450 nm. A photoluminescent emission peak was observed in the vicinity of 560 nm. FIG. 2 shows the photoluminescent spectrum. FIG. 3 shows the excitation spectrum when the photoluminescent wavelength is 560 nm.

TABLE 1

| | Factors in Formula (I) | | | | |
|---|---|---|---|---|---|
| | x | y | z | m | n |
| Example 1 | 0.030 | 0.510 | 0.150 | 1.5 | 0.75 |
| Comparative Example 1 | 0.000 | 0.525 | 0.150 | 1.5 | 0.75 |
| Example 2 | 0.075 | 0.488 | 0.150 | 1.5 | 0.75 |
| Example 3 | 0.150 | 0.450 | 0.150 | 1.5 | 0.75 |
| Example 4 | 0.300 | 0.375 | 0.150 | 1.5 | 0.75 |
| Example 5 | 0.600 | 0.225 | 0.150 | 1.5 | 0.75 |
| Comparative Example 2 | 0.900 | 0.075 | 0.150 | 1.5 | 0.75 |

Example 1

An amorphous silicon nitride powder obtained by the thermal decomposition of silicon diimide produced by reacting silicon tetrachloride and ammonia at room temperature, an aluminum nitride powder, a calcium carbonate powder, a europium oxide powder and lithium carbonate were weighed to give a composition shown in Table 1. The weighed powders were mixed by a vibration mill for 1 hour in a nitrogen atmosphere. The resulting powder mixture was filled in a carbon-made crucible, the crucible was set in a induction heating furnace and the furnace was heated by a temperature-rising schedule of holding the furnace at from temperature to 1,200° C. for 1 hour, at from 1,200 to 1,400° C. for 4 hours and at from 1,400 to 1,700° C. for 3 hours, whereby a sialon powder was obtained. This powder was evaluated on photoluminescent properties under the same conditions as in Comparative Example 1 by a photoluminescent measuring apparatus set to an excitation wavelength of 450 nm. A photoluminescent emission peak was observed in the vicinity of 560 nm. FIG. 2 shows the emission spectrum. From comparison with the emission spectrum of sialon powder obtained in Comparative Example 1, which is also shown in FIG. 2, it is seen that the photoluminescent intensity of Sialon-based phosphor having added thereto lithium is greatly increased to about 1.8 times the photoluminescent intensity of Sialon-based phosphor not containing lithium. FIG. 3 shows the excitation spectrum when the photoluminescent wavelength is 560 nm.

Examples 2 to 5

Sialon-based phosphor powders were produced in the same manner as in Example 1 except for changing the amounts of Li (factor x in formula (I)) and Ca (factor y in formula (I)) as shown in Table 1 and measured on the photoluminescent properties. The results are shown in FIG. 2.

Comparative Example 2

A Sialon-based phosphor powder was produced in the same manner as in Example 1 except for changing the amounts of Li (factor x in formula (I)) and Ca (factor y in formula (I)) as shown in Table 1 and measured on the photoluminescent properties. The results are shown in FIG. 2. It is seen that an excessively large lithium content rather causes reduction in the photoluminescent properties and this is not preferred.

Example 6

An amorphous silicon nitride powder similar to that of Example 1, an aluminum nitride powder, a calcium carbonate powder, lithium carbonate and a terbium oxide powder were weighed so as to obtain a composition having formula (I) with x=0.075, y=0.488, z=0.15, m=1.5 and n=0.75. Terbium was assumed to be a trivalent. The weighed powders were mixed and fired in the same manner as in Example 1.

The thus obtained powder was evaluated on the photoluminescence spectrum by a photoluminescent measuring apparatus set to an excitation wavelength of 254 nm. FIG. 4 shows the results, in which photoluminescence from the f—f transition of $Tb^{3+}$ was observed; the highest peak was present at around 544 nm; and the color of the spectrum was green. Incidentally the peak at around 507 nm is a peak appearing on measurement, not a peak form the sample. The photoluminescence of lithium-containing Sialon had an intensity about 1.6 times in comparison with Sialon containing no lithium.

Comparative Example 3

The same powders without lithium carbonate were used and weighed so as to obtain a composition having formula (I) with x=0, y=0.52, z=0.15, m=1.5 and n=0.75.

The thus-obtained powders was fired in the same manner as in Example 6 and the photoluminescence of the fired powder was evaluate in the same manner as in Example 6. The results are shown in FIG. 4.

The invention claimed is:

1. An α-Sialon based phosphor represented by the formula:

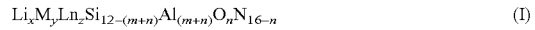

$$Li_xM_yLn_zSi_{12-(m+n)}Al_{(m+n)}O_nN_{16-n} \qquad (I)$$

wherein M is at least one metal selected from Ca, Mg and Y, Ln is at least one lanthanide metal selected from Eu, Dy, Er, Tb, Yb and Ce, x+ay+bz=m (assuming that the valence of metal M is a and the valence of lanthanide metal Ln is b), 0<x≦0.8, 0<y≦1.5, 0<z≦1.5, 0.3≦m<4.5, and 0<n<2.25.

2. The α-Sialon based phosphor as claimed in claim 1, wherein the metal M is Ca and the lanthanide metal Ln is Eu.

3. The α-Sialon based phosphor as claimed in claim 1, wherein x is 0.01<x≦0.3.

4. The α-Sialon based phosphor as claimed in claim 3, wherein x is 0.03<x≦0.2.

5. The α-Sialon based phosphor as claimed in claim 1, wherein 1.0≦m≦3.5 and 0.5≦n≦2.0.

6. A method for producing the α-Sialon based phosphor claimed in any one of claims 1 to 5, comprising:
   mixing an oxide of Li, or a precursor substance which becomes the oxide of Li, upon thermal decomposition, an amorphous silicon nitride, an aluminum compound containing AlN as an aluminum source, an oxide of said metal M, or a precursor substance which becomes the oxide of the metal M upon thermal decomposition, and an oxide of the lanthanide metal Ln, or a precursor substance which becomes the oxide of the lanthanide metal Ln upon thermal decomposition to obtain a powder mixture, and
   firing the powder mixture at 1,400 to 2,000° C. in an inert gas atmosphere containing nitrogen.

7. The method for producing the α-Sialon based phosphor as claimed in claim 6, wherein said amorphous silicon nitride is an amorphous silicon nitride powder obtained by the thermal decomposition of silicon diimide ($Si(NH)_2$).

8. The method for producing the α-Sialon based phosphor as claimed in claim 6, wherein said firing is performed at 1,600 to 2,000° C. in a pressurized nitrogen gas atmosphere.

9. A light emitting diode apparatus comprising a light emitting diode and the α-Sialon based phosphor claimed in any one of claims 1 to 5.

10. A white light emitting diode apparatus comprising a blue or violet light emitting diode and the α-Sialon based phosphor claimed in any one of claims 1 to 5.

11. The white light emitting diode apparatus as claimed in claim 10, wherein in said α-sialon phosphor, the metal M is Ca and the lanthanide Ln is Eu.

12. The light emitting diode apparatus as claimed in claim 9, wherein the α-Sialon based phosphor is dispersed in a resin.

13. The light emitting diode apparatus as claimed in claim 10, wherein the α-Sialon based phosphor is dispersed in a resin.

* * * * *